United States Patent [19]
Anderson et al.

[11] Patent Number: 5,477,198
[45] Date of Patent: Dec. 19, 1995

[54] EXTENDIBLE-RANGE VOLTAGE CONTROLLED OSCILLATOR

[75] Inventors: Michael B. Anderson, Colorado Springs; Frank Gasparik, Monument, both of Colo.

[73] Assignees: AT&T Global Information Solutions Company, Dayton, Ohio; Hyundai Electronics America, Milpitas, Calif.

[21] Appl. No.: 264,863

[22] Filed: Jun. 23, 1994

[51] Int. Cl.$^6$ .................................................. H03B 5/00
[52] U.S. Cl. .................. 331/177 R; 331/57; 331/107 R
[58] Field of Search ................................. 331/8, 10, 11, 331/34, 57, 107 R, 177 R; 327/261, 392, 264, 272, 278, 285, 290

[56] References Cited

U.S. PATENT DOCUMENTS

| | | | |
|---|---|---|---|
| 3,546,617 | 12/1970 | Westwood | 331/2 |
| 4,388,596 | 6/1983 | Yamashita | 331/1 A |
| 4,568,888 | 2/1986 | Kimura et al. | 331/10 |
| 4,853,654 | 8/1989 | Sakurai | 331/57 |
| 4,879,530 | 11/1989 | Wilhelm et al. | 331/45 |
| 4,890,072 | 12/1989 | Espe et al. | 331/11 |
| 4,918,404 | 4/1990 | Vitiello et al. | 331/11 |
| 4,935,706 | 6/1990 | Schenberg | 331/11 |
| 4,975,662 | 12/1990 | Takeuchi | 331/111 |
| 4,988,955 | 1/1991 | Horie | 331/11 |
| 5,028,888 | 7/1991 | Ray | 331/57 |
| 5,070,311 | 12/1991 | Nicolai | 331/111 |
| 5,081,429 | 1/1992 | Atriss et al. | 331/57 |
| 5,105,169 | 4/1992 | Yamazaki et al. | 331/34 |
| 5,121,086 | 6/1992 | Srivastava | 331/11 |
| 5,136,260 | 8/1992 | Yousefi-Elezei | 331/17 |
| 5,142,249 | 8/1992 | Hirotomi | 331/57 |
| 5,198,784 | 3/1993 | Fenk | 331/117 R |
| 5,208,557 | 5/1993 | Kersh, III | 331/57 |
| 5,250,913 | 10/1993 | Gleichert et al. | 331/25 |
| 5,278,522 | 1/1994 | Atriss et al. | 331/57 |
| 5,285,173 | 2/1994 | Reynolds | 331/57 |
| 5,300,898 | 4/1994 | Chen et al. | 331/57 |
| 5,302,920 | 4/1994 | Bitting | 331/45 |
| 5,331,295 | 7/1994 | Jelinek et al. | 331/57 |

OTHER PUBLICATIONS

Kurt M. Ware et al.; A 200-MHz CMOS Phase–Locked Loop with Dual Phase Detectors; Dec., 1989; pp. 1560–1568.

Deog-Kyoon Jeong et al.; Design of PLL-Based Clock Generation; Apr., 1987; pp. 255–261.

*Primary Examiner*—Robert J. Pascal
*Assistant Examiner*—David Vu
*Attorney, Agent, or Firm*—Wayne P. Bailey

[57] ABSTRACT

A circuit design extending the range and linearizing the transfer characteristic of a fast voltage controlled oscillator (VCO). In addition, a multi-range VCO is described. Range extension is achieved by modifying the delay cell of a current controlled ring oscillator. The VCO transfer characteristic is linearized by piece-wise linear current control added to the delay cell. Additionally, a VCO capable of multi-range operation is provided. With the addition of multiple current sources which control booster inverter current, and by selectively enabling the additional current sources, a VCO with multiple frequency ranges can be achieved.

12 Claims, 16 Drawing Sheets

FIG. 1

PRIOR ART

FIG. 2

PRIOR ART

EXTENDIBLE-RANGE VOLTAGE CONTROLLED OSCILLATOR

CROSS REFERENCE TO RELATED APPLICATIONS

The present invention is related to commonly assigned and co-pending U.S. application entitled "Multi-Range Voltage Controlled Oscillator", invented by Anderson and Schmitt, having a Ser. No. 08/264,862 and filed concurrently herewith; and pending U.S. application entitled "Bias Compensation for a Voltage Controlled Oscillator", invented by Anderson, having a Ser. No. 08/264,815 and filed concurrently herewith; and both of which are hereby incorporated by reference.

1. Technical Field

The present invention relates to high speed circuit operation, and more particularly to a way for improving the operating characteristics of a phase-locked loop integrated circuit.

2. Background of the Invention

High-speed serial links are becoming more common, replacing bulkier parallel connectors. Speeds for these high-speed serial links vary according to differing industry standards. Serial interface chips generally require the use of a phase-locked loop (PLL) to generate a clock for data transmission, and another PLL for data reception.

Fast PLL circuits employ fast voltage controlled oscillators (VCO). The operating speed of the VCO determines what frequencies the serial interface chips will operate. Different operating speeds are accomplished by frequency division and multiplication. However, if an operating speed cannot be achieved through frequency division and multiplication, an additional VCO must be incorporated into the design. The chip could be programmed to operate at the different operating speeds by choosing the appropriate oscillator.

In reality, only a couple of the operating speeds can be achieved using frequency division and multiplication. VCO ranges are only so large, and adding an additional VCO complicates design and uses more silicon area. A simpler solution would be to have a single VCO that would operate in different frequency ranges. Having the ability for one integrated circuit chip to achieve several operating speeds would also be beneficial.

The operating range of a VCO (i.e. the range of possible output frequencies for a particular range of input voltages) is another important aspect to consider when designing a fast PLL circuit. One way to implement a VCO is by use of a ring oscillator. Ring oscillators can be derived from cascaded delay cells. The number of delay cells, and the delay time of each delay cell, determines the operating frequency. The delay time of the delay cell can vary with temperature, supply voltage and process, sometimes pushing the operating range far from the desired operating point.

In phase-locked loop applications, voltage controlled ring oscillators with starved inverter delay cells are sometimes used when designing CMOS integrated circuits. Using booster inverters in parallel with the starved inverter delay cells results in a faster operating frequency. However, the frequency range is limited at the low end of the frequency range due to the booster inverter. There is a tradeoff between how large the booster inverter is and how high the frequency range is, and how small the booster inverter is and how low the frequency range is. In summary, the addition of a booster inverter increases the speed of the oscillator, but limits the frequency range of the oscillator.

When designing high frequency VCOs, frequency drift (from the desired operating point) due to process variation can cause a low yield. If the frequency range could be extended to obtain overlap between process variations, a higher yield could be obtained.

SUMMARY OF THE INVENTION

It is an object of the present invention to provide an improved VCO.

It is a further object of the present invention to provide a multi-range VCO.

It is yet another object of the present invention to provide an extendible-range VCO.

The present invention is an improved VCO having plural operating ranges. This multi-range VCO design has the ability to operate at two or more operating ranges, thus enhancing the ability to manufacture high-speed serial links with several operating speeds. By modifying the ring oscillator delay cells, more than one operating speed can be achieved. By adding current sources to the booster inverters, and selectively scaling this current, the frequency range of the delay cells can be significantly altered, resulting in a multi-range VCO.

A linear, wide-range VCO is also provided by the present invention. This design allows the frequency range of a VCO to be extended, and adds a circuit to linearize the response. In addition, it reduces the VCO's response to process variation.

DETAILED DESCRIPTION OF THE PREFERRED EMBODIMENT

Figure 1:
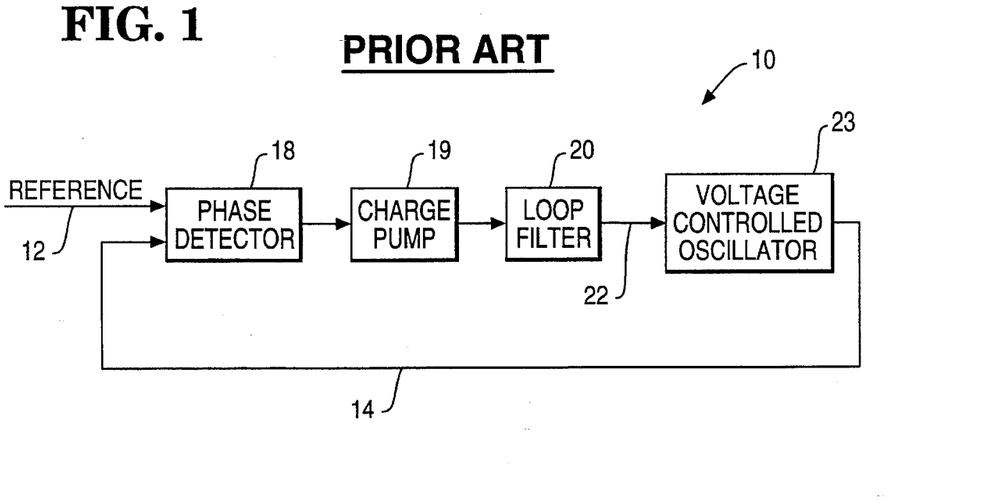
FIG. 1 shows a traditional phase-locked loop circuit.

The block diagram for a typical phase-locked loop is shown at 10 in FIG. 1. The input reference phase 12 is compared at 18 to the output 14 of the VCO 23. The charge pump 19 regulates the amount of charge on the loop filter 20. The output 22 of the loop filter 20 is a voltage that controls the frequency of the oscillator 23. A VCO 23 typically consists of two stages: a voltage to current (V-I) converter, and a current controlled oscillator (ICO). The VCO output frequency varies proportionally to the input voltage of the V-I converter.

Figure 2:
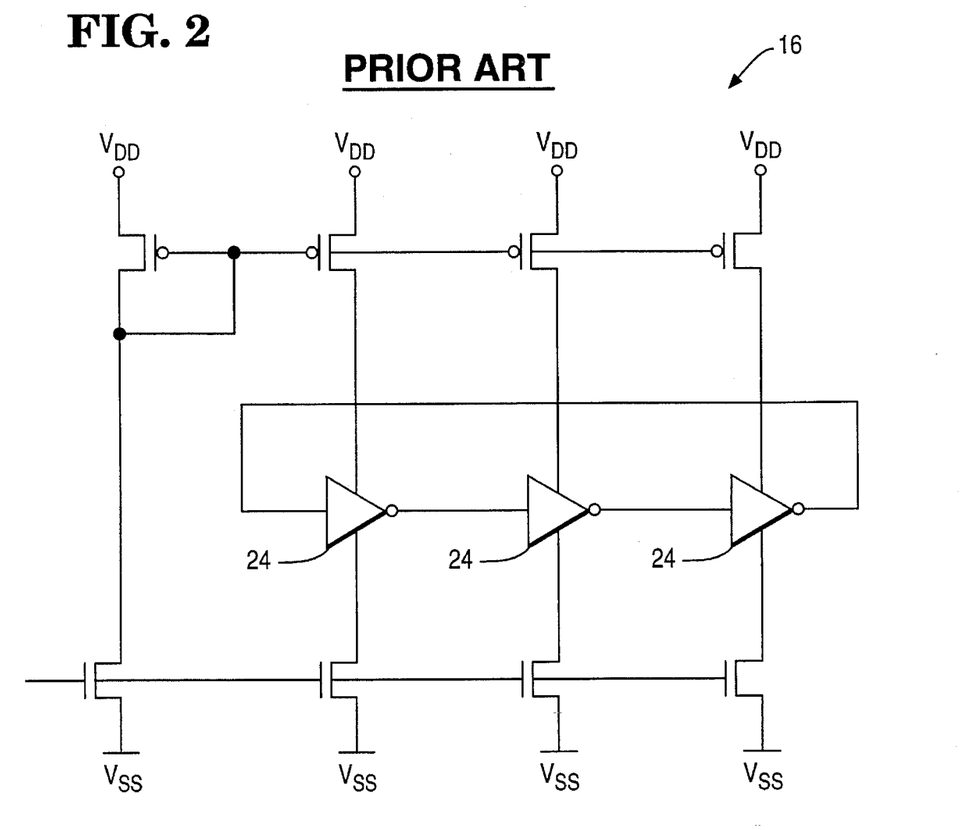
FIG. 2 shows a ring oscillator constructed using delay cells.

Oscillator 23 typically contains a current controlled oscillator 16, as shown in FIG. 2. The ICO has an odd number of delay cells. Each delay cell 24 is essentially a current controlled inverter. Since there is an odd number of delay cells, the delay cells are constantly changing state at a speed determined by the propagation delay of each cell. By varying the current in the delay cell, the propagation delay of each cell is varied, and thus the frequency of the ICO is varied.

Figure 3:
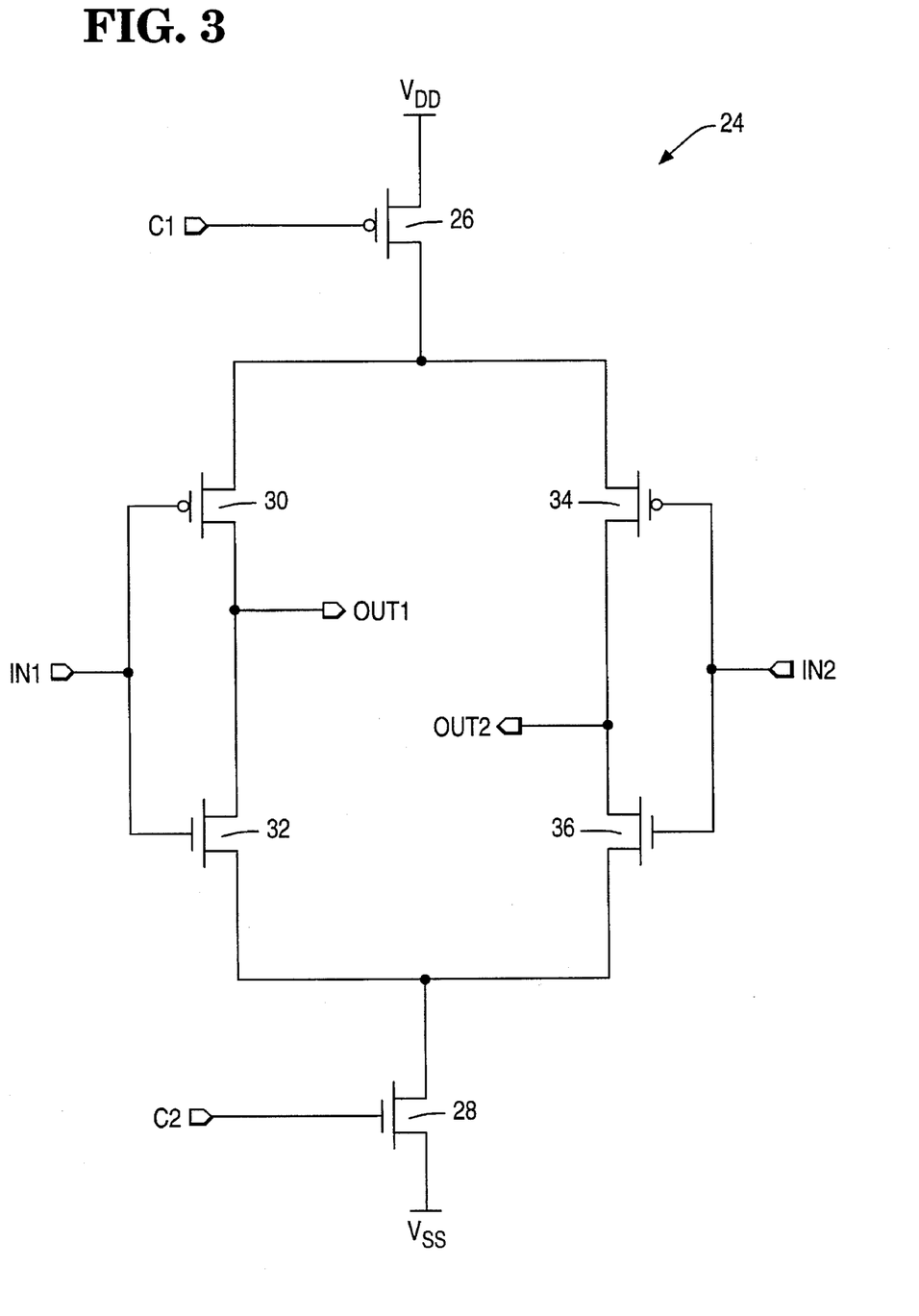
FIG. 3 shows a differential current starved inverter.

A detailed schematic for one of the delay cells of FIG. 2 is shown in FIG. 3. The delay cell is a current starved differential inverter 24. The starved inverter current is biased at 26 and 28 by a V-I converter (not shown), whose output is mirrored to inputs C1 and C2. As the input voltage of the V-I converter increases, the mirrored inverter current in the delay cell increases, which in turn increases the operating speed of the oscillator.

More specifically, signals IN1 and IN2 are two inverter inputs, and signals OUT1 and OUT2 are two inverter output signals, of differential inverter 24. N-FET and P-FET transistors 30 and 32 provide an inverted signal from input IN1 to output OUT1. Similarly, N-FET and P-FET transistors 34 and 36 provide an inverted signal from input IN2 to output OUT2. Inputs IN1 and IN2 are 180 degrees out of phase with respect to each other. Similarly, outputs OUT1 and OUT2 are 180 degrees out of phase with respect to each other. Control inputs C1 and C2 vary the current through the inverter, and thus the propagation delay of the delay cell is varied. This in turn varies the frequency of the oscillator. In particular, P-FET 26 acts as a current source, and is regulated by the input C1. Similarly, N-FET 28 acts as a current source, and is regulated by the input C2. An increase in the bias current in the delay cell results in faster operation of the inverter, and hence a VCO operating at a higher frequency.

Figure 4:
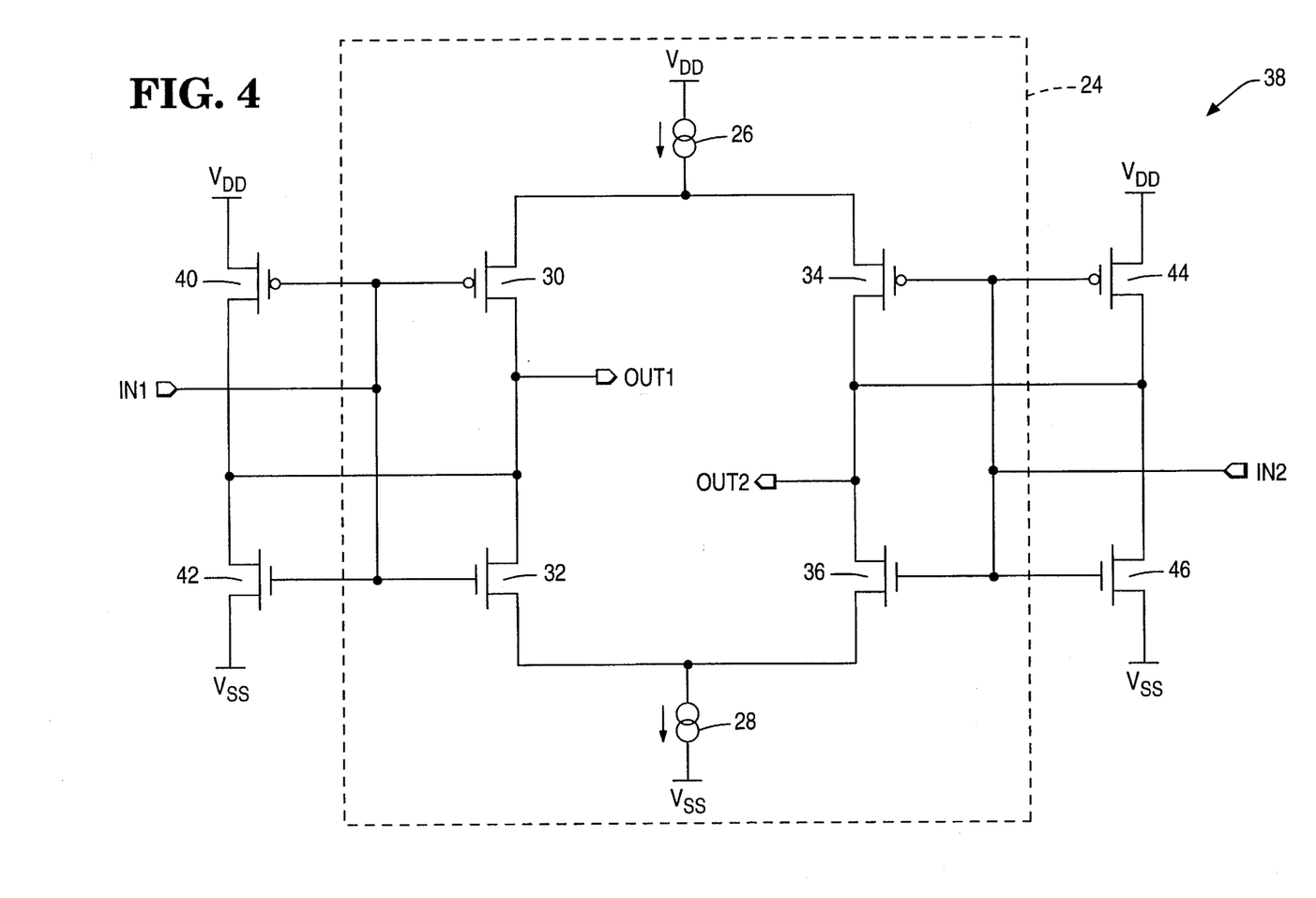
FIG. 4 shows a delay cell comprising a main current starved inverter and a booster inverter.

By incorporating a booster inverter to the main current starved inverter, a more robust delay cell is achieved. This improved delay cell is illustrated at 38 in FIG. 4. The booster inverter is comprised of four FET transistors 40, 42, 44 and 46. The booster inverter transistors increase the frequency of the oscillator. A balance must be found between the strength of the main starved inverter and the booster inverter. As the strength of the booster inverter is increased, the frequency range of the VCO is shifted to a higher frequency. As the strength of the booster is decreased, the frequency range of the VCO is shifted to a lower frequency. With proper device sizing, a balance between frequency and linearity can be achieved. However, if a wider frequency range is required, this arrangement is insufficient. The addition of the booster inverters increases the speed of the oscillator, but limits the frequency range.

Extendible-Range VCO

Figure 5:
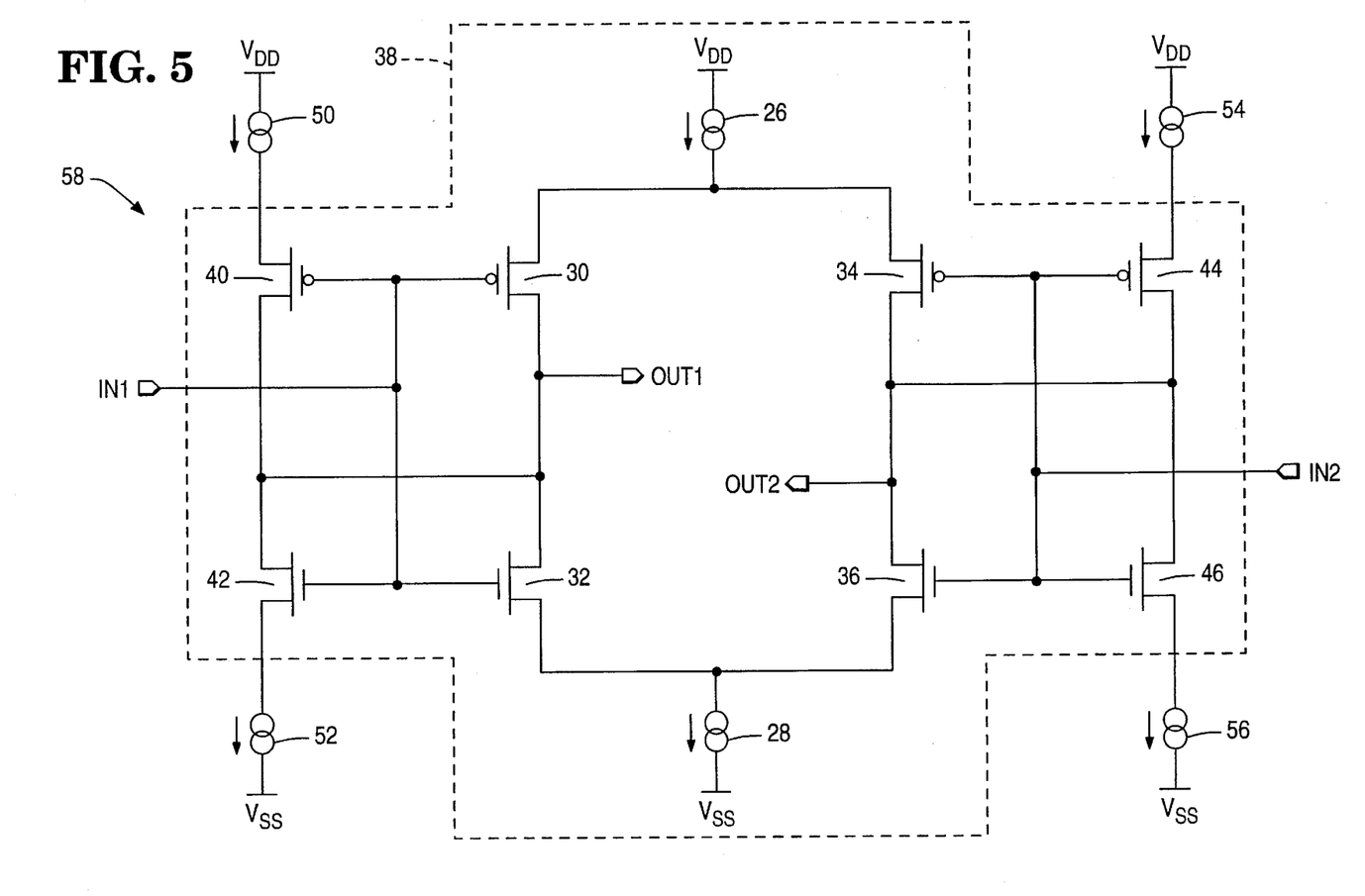
FIG. 5 shows a delay cell comprising a main current starved inverter and a current controlled booster inverter.

To achieve a wider frequency range of operation, a plurality-of voltage controlled current sources are implemented to restrict the current in the booster inverters, as shown in FIG. 5. This implementation achieves three desirable effects. First, the current sources 50, 52, 54 and 56 restrict current through the booster inverters, thus reducing power consumption.

Second, the reduced current helps to minimize the effects of process variation. That is, a best case inverter when connected directly to Vdd and Vss would draw more current than a worst case inverter, which in turn affects propagation delay. With the use of a current source, the current is kept constant. The constant current in the booster inverters reduces the sensitivity of the delay cell to process variation. With a constant current, the propagation delay does not vary as much, thus a reduced sensitivity to process variation.

Third, the VCO can be controlled to lower frequencies. For example, if we size the inverter devices to achieve the shortest propagation delay, the current controlled capability of the booster circuits allows the delay cell current to be starved in both the main starved inverter and the booster inverter. Thus, a lower frequency is achievable. Yet, a short propagation delay still exists for high frequency operation. This results in a VCO with a wide or extended range of operation.

Figure 6:
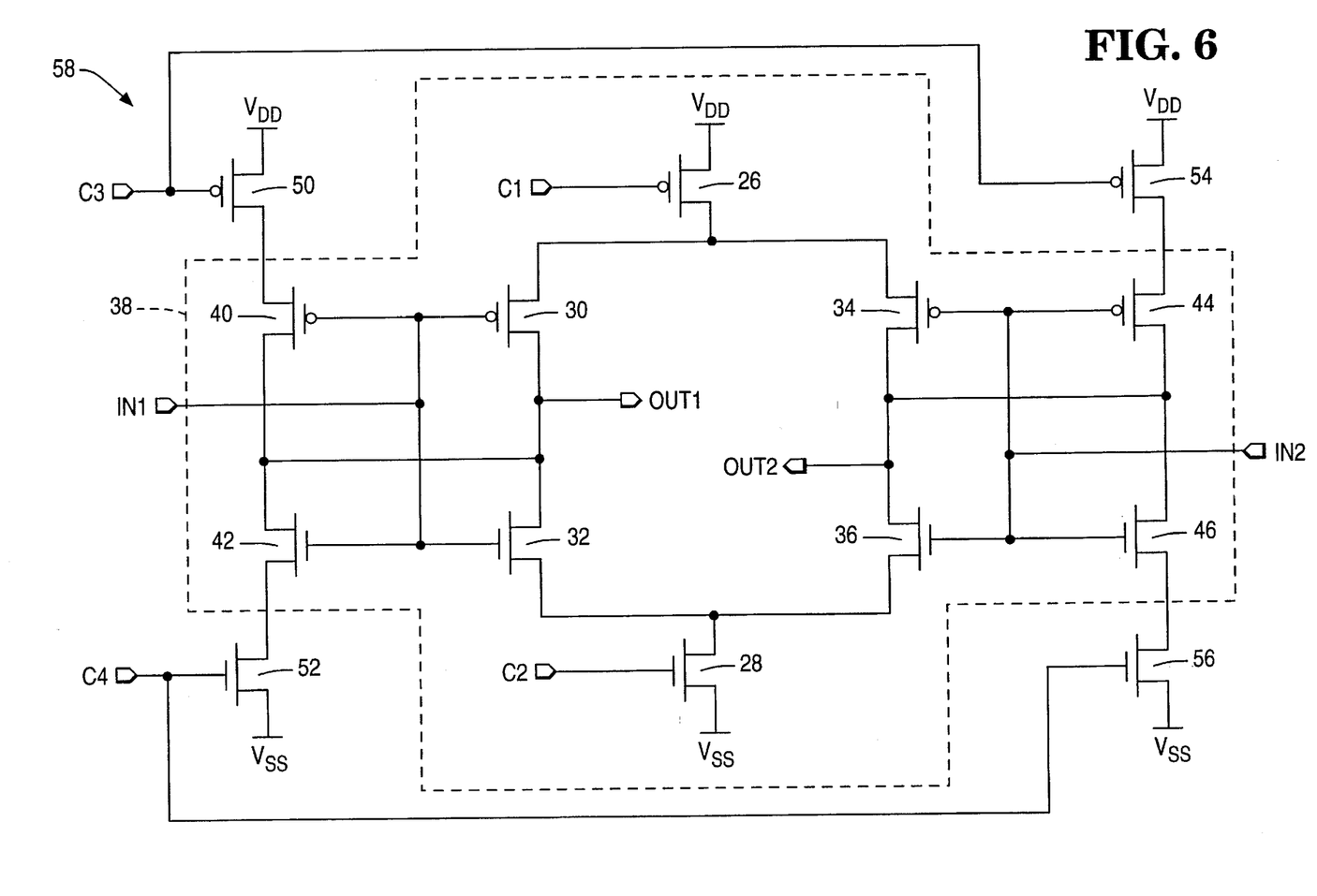
FIG. 6 shows a realized circuit schematic for the delay cell of FIG. 5.

The circuit realization for delay cell 58 of FIG. 5, including the devices for the voltage controlled current sources 50, 52, 54 and 56, as well as for the voltage controlled current sources 26 and 28, is shown in FIG. 6. Current source 26 is biased by input C1, and current source 28 is biased by input C2. Current sources 50 and 54 are biased by input C3, and current sources 52 and 56 are biased by input C4.

Figure 7:
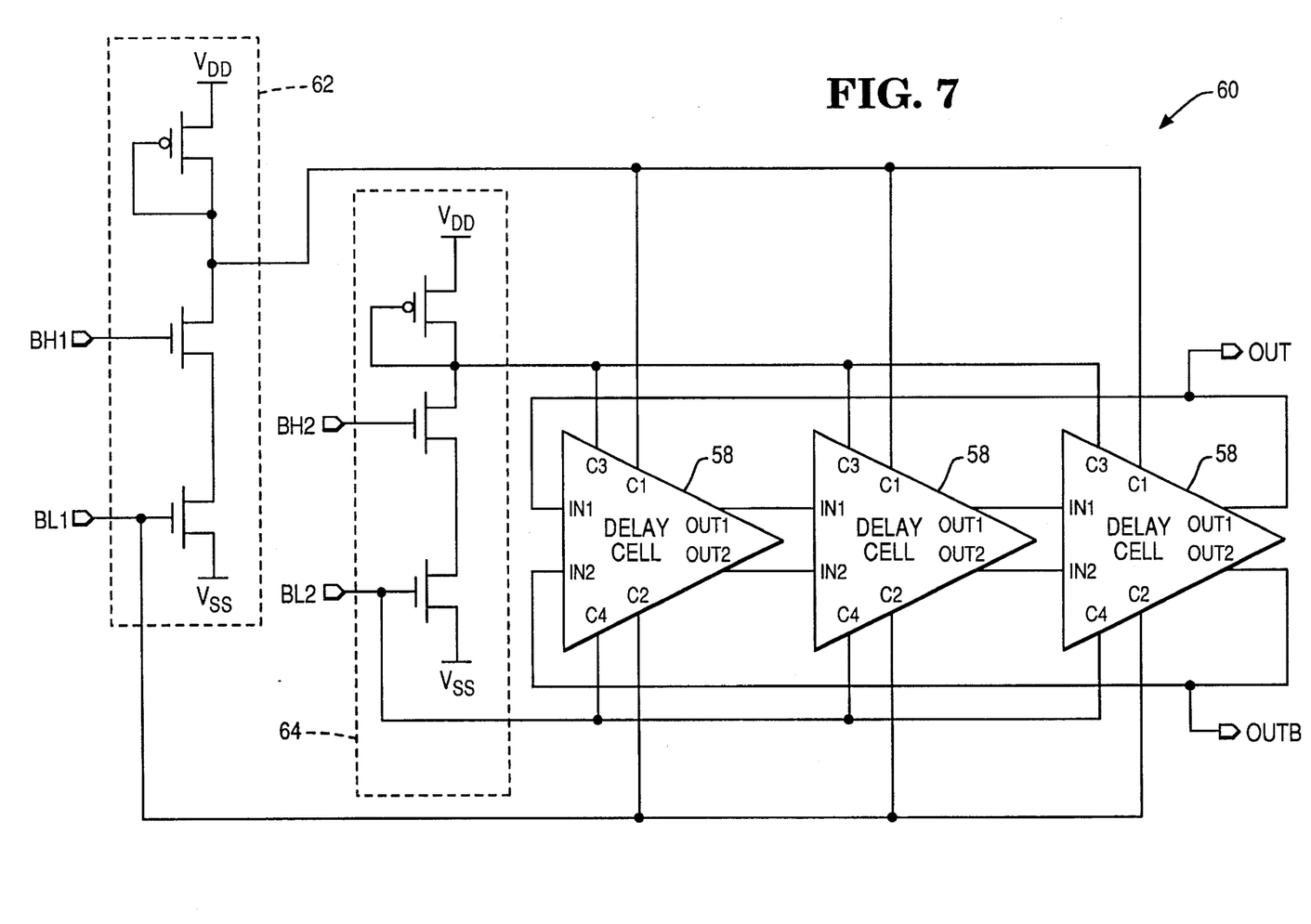
FIG. 7 shows an improved ICO.

A schematic for the improved current controlled oscillator 60 is shown in FIG. 7. Note the two bias circuits 62 and 64, which are needed to drive the inputs labeled C1, C2, C3 and C4 in FIG. 7. The control of these current mirror bias circuits 62 and 64 will be further described below.

The next challenge is to decide how to bias the booster inverter current sources 50, 52, 54 and 56 of delay cells 58. If they are biased similarly to the main starved inverter, a nonlinear response is obtained. If they are held constant, a reduced frequency range is obtained. To overcome this drawback, a piece-wise linear biasing scheme is adapted. For example, the current of the booster inverters is held constant at lower frequencies reducing the nonlinear response at the low end. At higher frequencies where the response would normally roll-off, the booster inverters are linearly increased, thus increasing the range, and linearizing the circuit.

Figure 8:
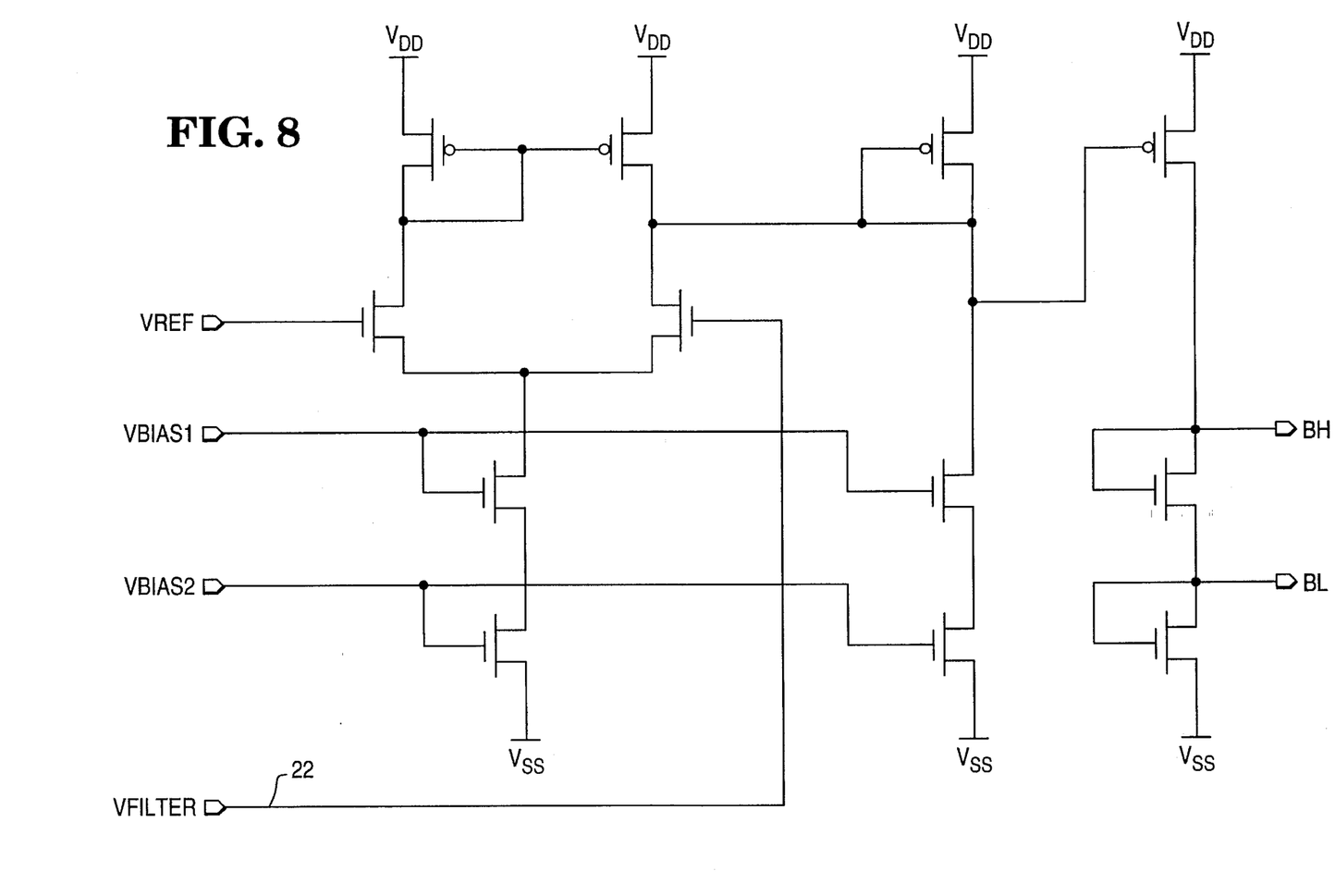
FIG. 8 shows a voltage to current converter circuit.

To accomplish voltage control of the current controlled oscillator, two V-I converters are used; one for the main starved inverter 24, and one for the booster inverter current sources 50, 52, 54 and 56. The outputs of these two V-I converters are coupled, respectively, to the current mirrors 62 and 64 shown in FIG. 7. Current mirror 62 is controlled by inputs BH1 and BL1, and current mirror 64 is controlled by inputs BH2 and BL2. The preferred V-I converter for providing one set of BH and BL current mirror inputs is shown in FIG. 8. In the example shown, outputs BH and BL are generated for inputs BH1 and BL1 of current mirror 62. A duplicate V-I converter circuit (hereinafter the booster V-I converter) is used to generate current mirror inputs BH2 and BL2 for current mirror 64.

The current bias for the circuit in FIG. 8 is derived from a typical band gap voltage reference commonly known in the art, and mirrored to inputs VBIAS1 and VBIAS2. Input VREF is set at a static DC voltage, preferably 2.5 volts for the main V-I converter and 2.9 volts for the booster V-I converter. Input VFILTER is the loop filter output voltage, as indicated at 22 of FIG. 1.

Figure 9:
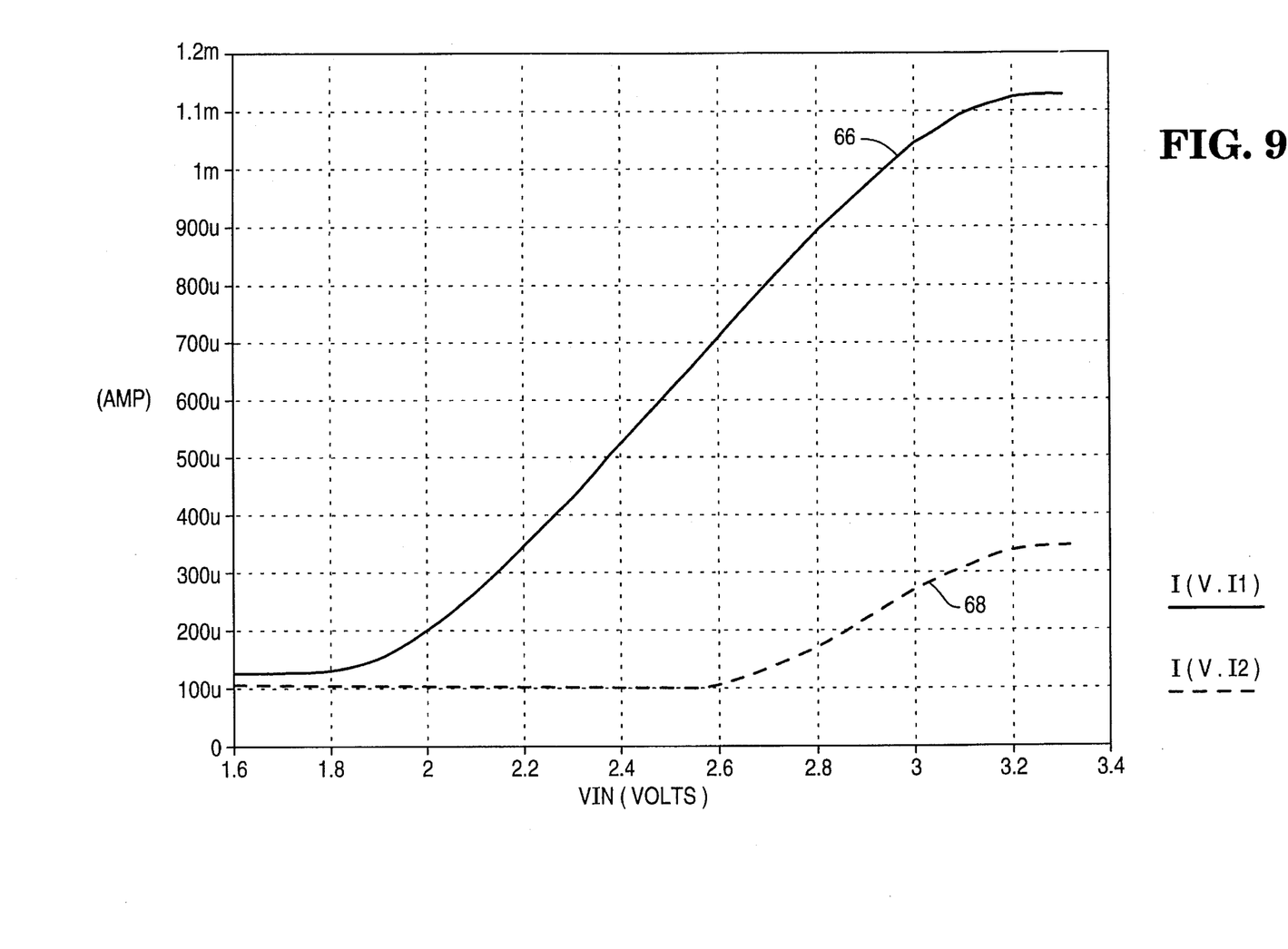
FIG. 9 shows a response plot for two voltage-to-current converters.

A plot of the current control response of both the main starved inverter and the booster inverter is shown in FIG. 9. The solid curve 66 is the main starved inverter V-I curve. As shown at 68, the booster inverter current sources are kept constant for the lower frequencies. The booster V-I converter is designed, by selecting appropriate device sizes using techniques commonly known in the art, such that the booster inverters are linearly turned on at approximately 2.6 volts (as shown by the dotted curve 68 in FIG. 9), to extend and linearize the response just before the main starved inverters would otherwise roll-off (i.e. where an increase in current results in minimal increase in frequency).

Figure 10:
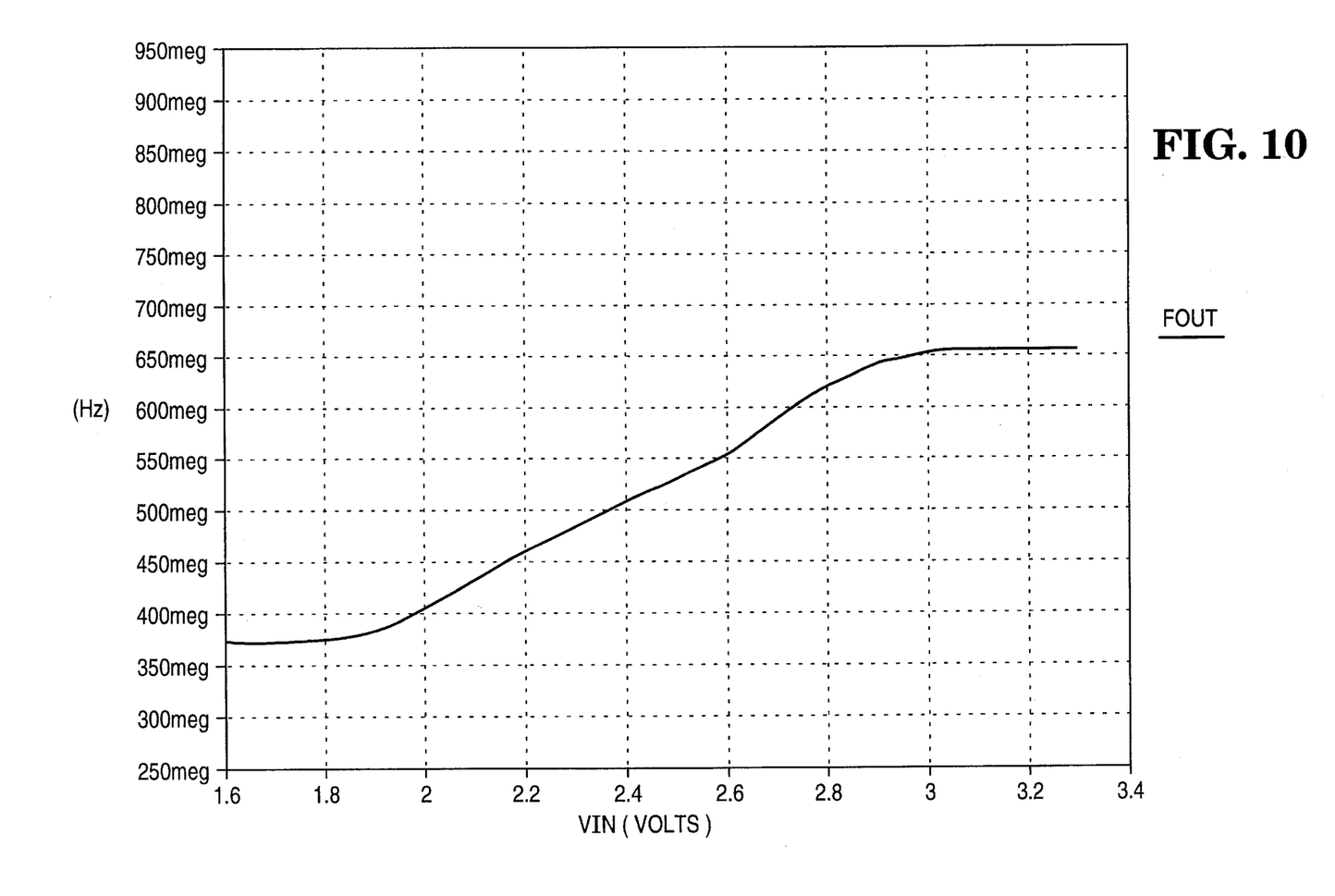
FIG. 10 shows the frequency response curve for an improved VCO.

The response of the complete VCO, containing the V-I converters and the current controlled oscillator with the enhanced delay cell, is shown in FIG. 10. Note that the oscillator range is approximately 285 MHz (370 MHz –655 MHz). Compared with a similar ring oscillator designed in the same technology which is 200 MHz, we note an approximate increase in range of approximately 30%. In summary, this response is achieved by adding current sources to the booster inverters, and controlling them in such a way as to linearize the resulting response over a broad frequency range.

Multi-Range VCO

Figure 11:
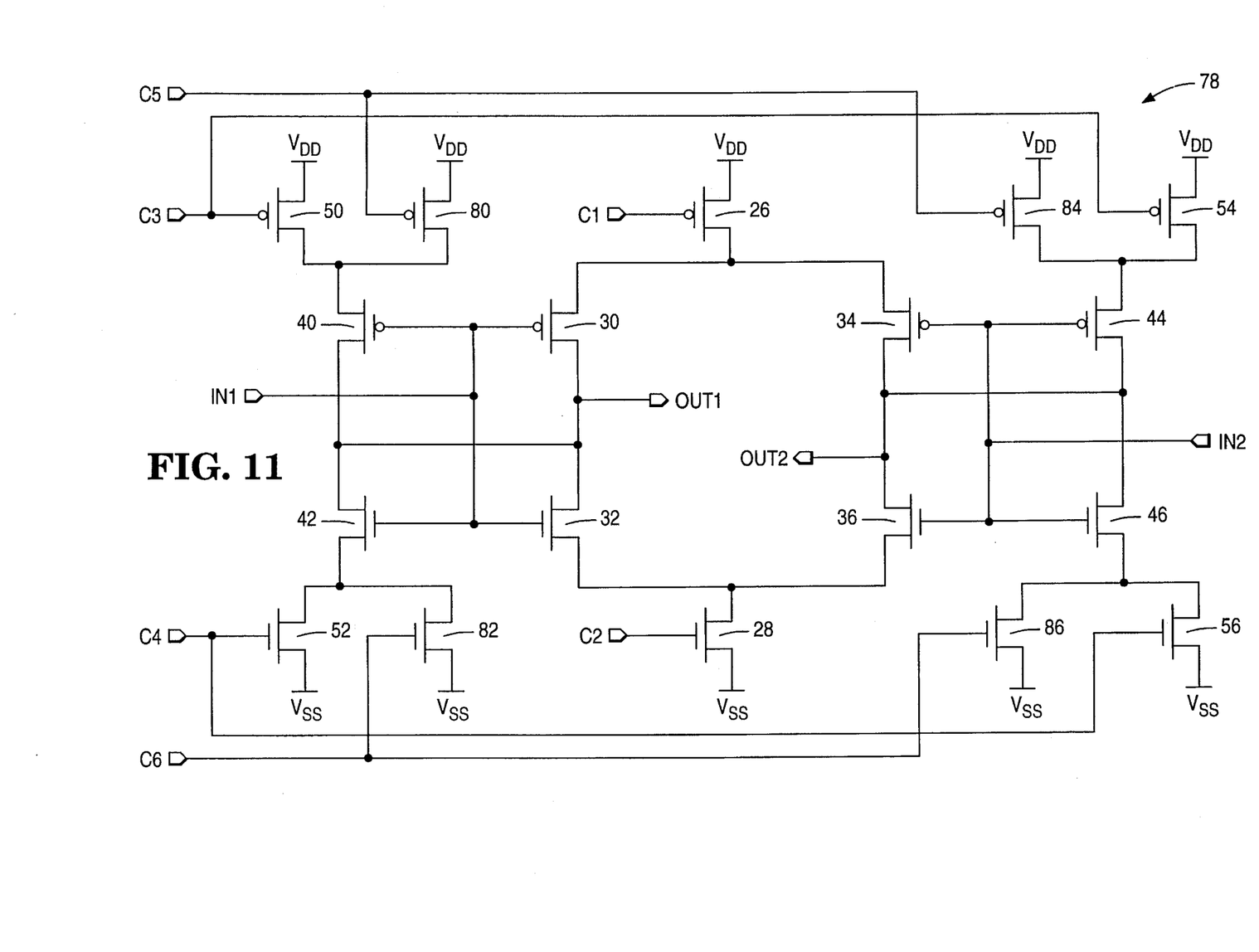
FIG. 11 shows a delay cell for a multi-range VCO, where booster inverter current sources have scaled current biasing.

An additional operating range can be achieved by scaling the current in the booster inverter current sources 50, 52, 54 and 56. That is, by scaling the current in the booster inverters, the frequency range can be significantly altered, thus achieving multi-range operation. The actual delay cell circuitry for this multi-range VCO is shown in FIG. 11. There are four extra devices added to the previously described delay cell of FIG. 6. The extra devices 80, 82, 84 and 86 are the four current sources needed to change/scale the booster inverter bias. In the preferred embodiment, only one pair of current sources is on at a time, by either activating inputs C3 and C4, or by activating inputs C5 and C6. However, the current sources could all be on or off, further modifying the operating frequency range of the delay cell/VCO. The complete current controlled ring oscillator with multi-range capability is shown in FIGS. 12A–B.

Figure 12A:
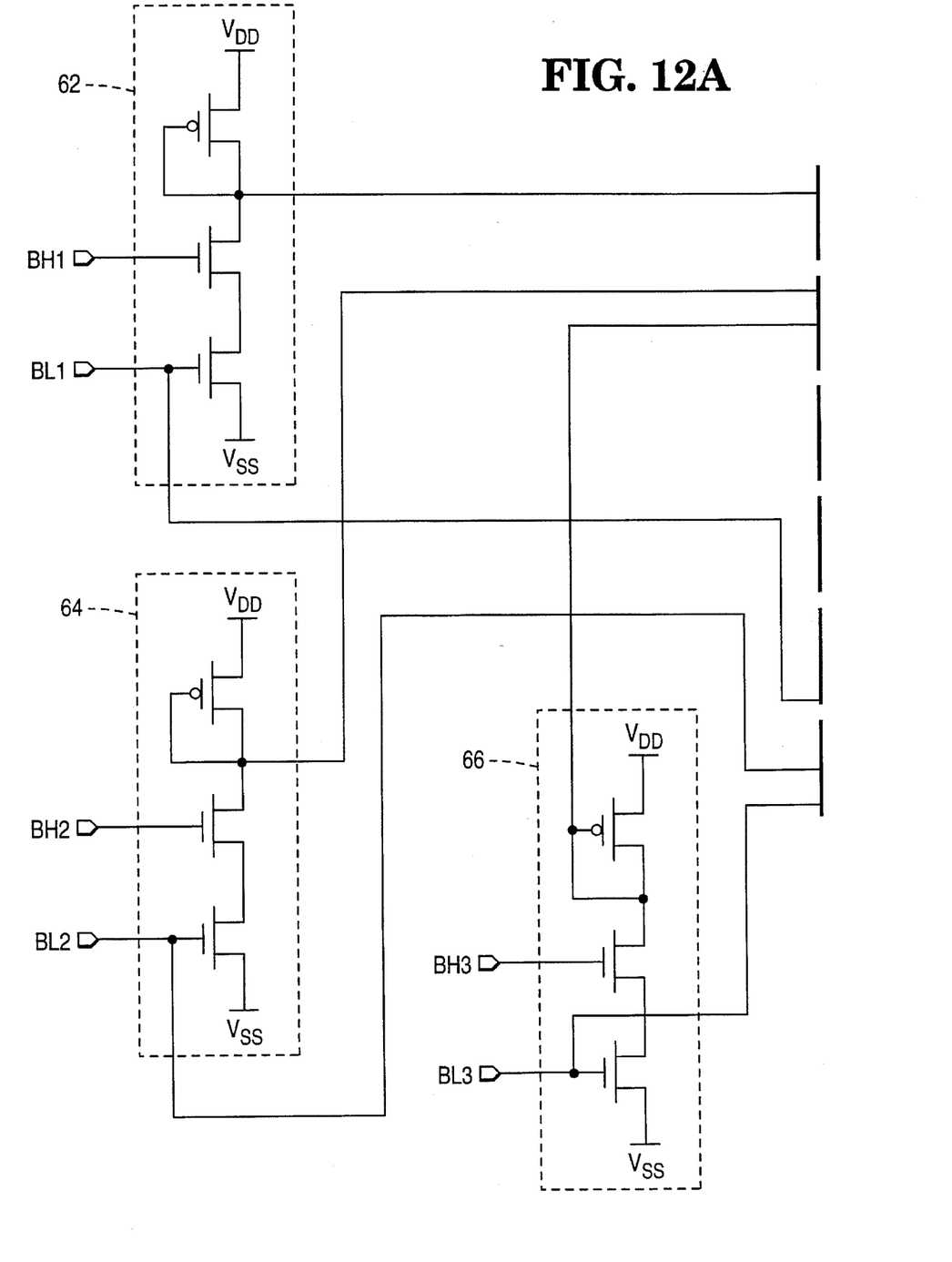
FIGS. 12A–B show a multi-range ICO using a plurality of delay cells as depicted in FIG. 11.
Figure 12B:
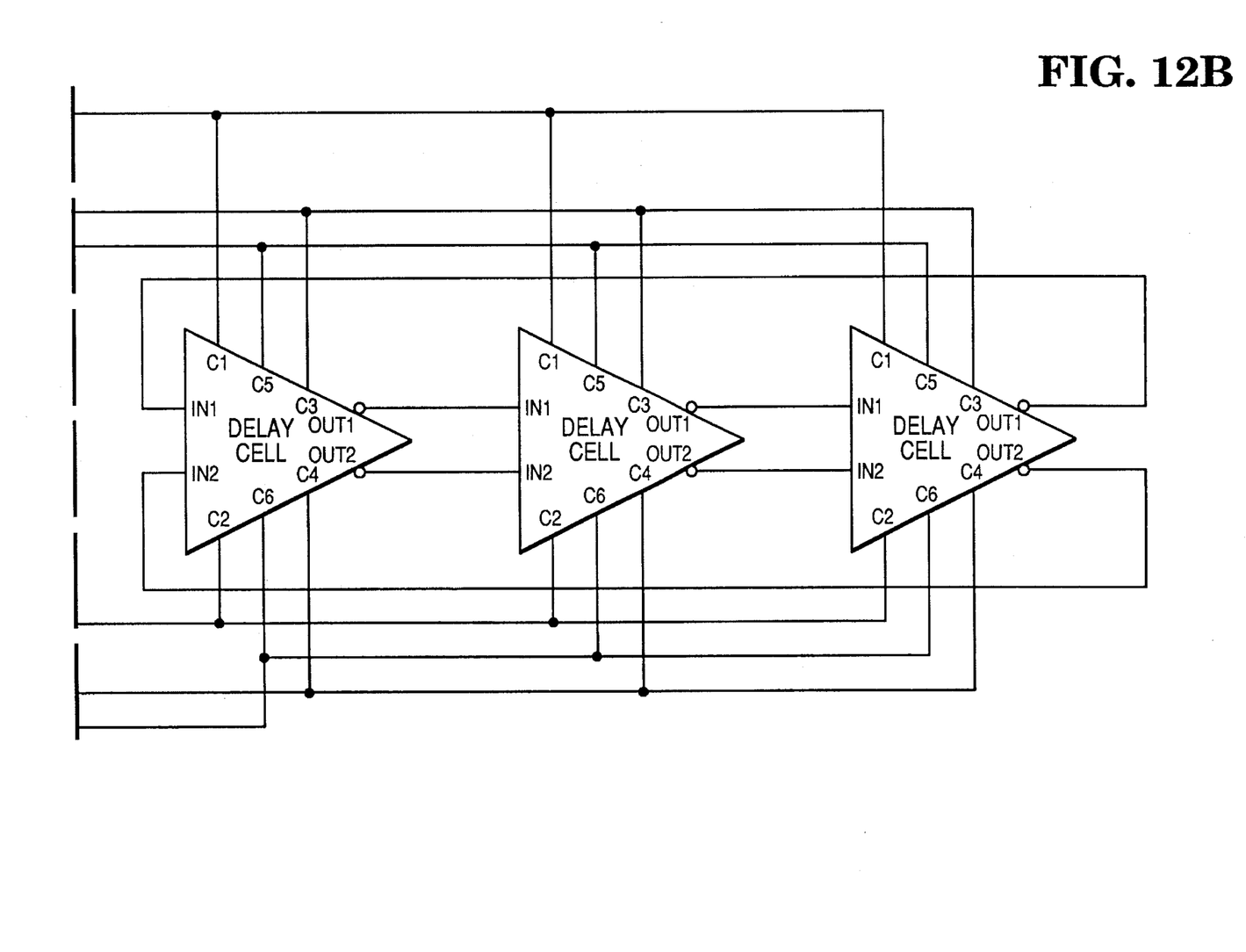
Figure 13A:
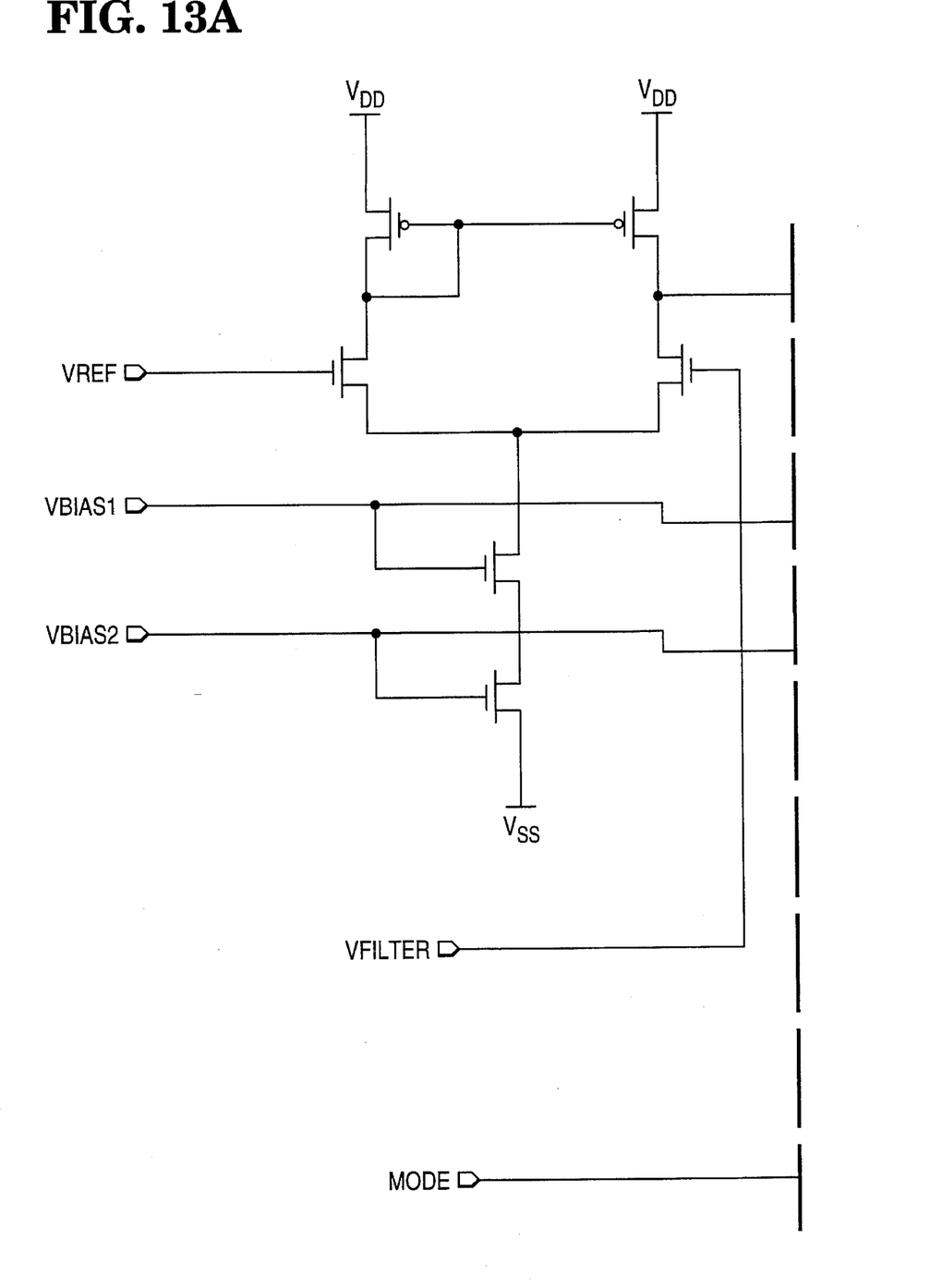
FIGS. 13A–B show a voltage to current converter with current scaling.
Figure 13B:
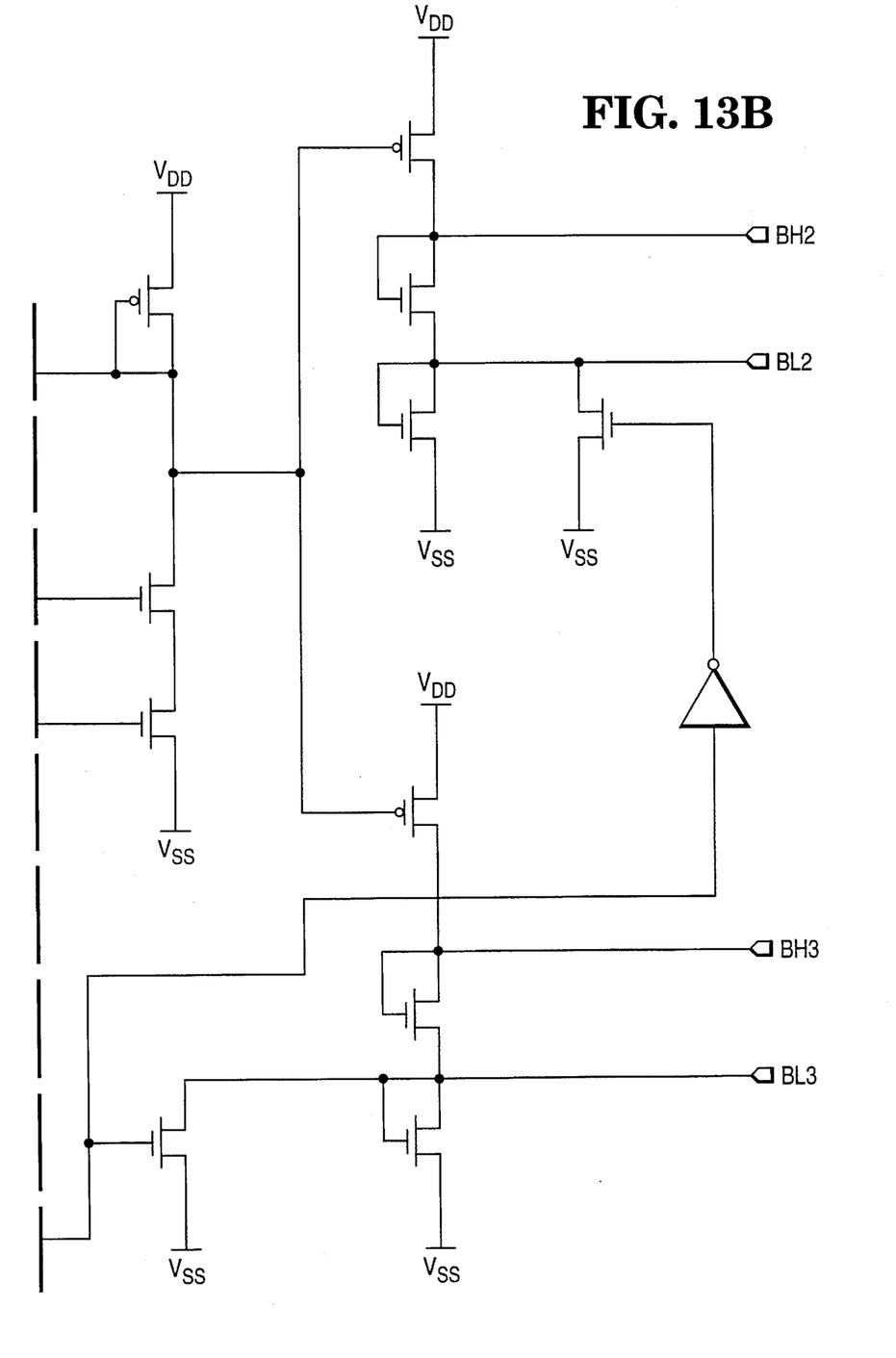

For this circuit in FIGS. 12A–B to work properly, an extra current mirror 66 is needed. This additional current mirror requires another output from the booster V-I converter. The preferred embodiment for this booster V-I converter with additional current mirror is shown in FIGS. 13A–B. This circuit works similarly to the circuit in FIG. 8, except that a choice can be made to select the appropriate current mirror with the MODE input. This MODE input of the V-I converter insures that only one current mirror is on at a time. The MODE input is a digital input that is controllable by a user. Any type of device capable of generating digital output signals, such as a custom control circuit, microcontroller, or other programmable device having output signals, could drive the MODE input signal.

Figure 14:
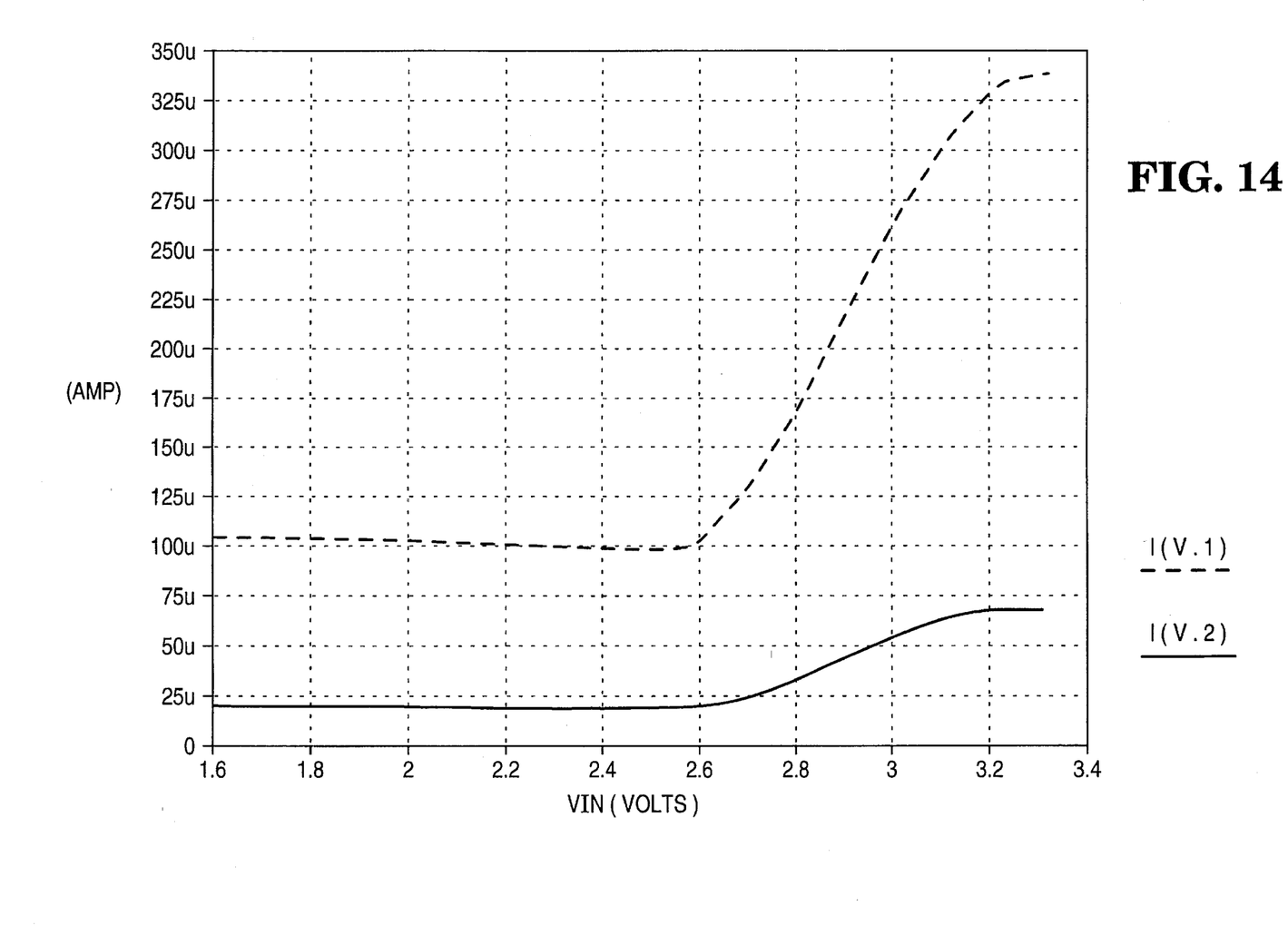
FIG. 14 shows a response plot of voltage to current converters with current scaling.

The plot in FIG. 14 illustrates how the current in the booster inverters are being modulated by the input voltage. The larger current (as indicated by the dotted line) is for the faster response. The current through the main starved inverter is linearly swept, as was previously described with respect to the output current 66 in FIG. 9. If a wide frequency range is not required, the current in the booster inverters can be kept constant across the whole range, and then scaled for different operating ranges.

Figure 15:
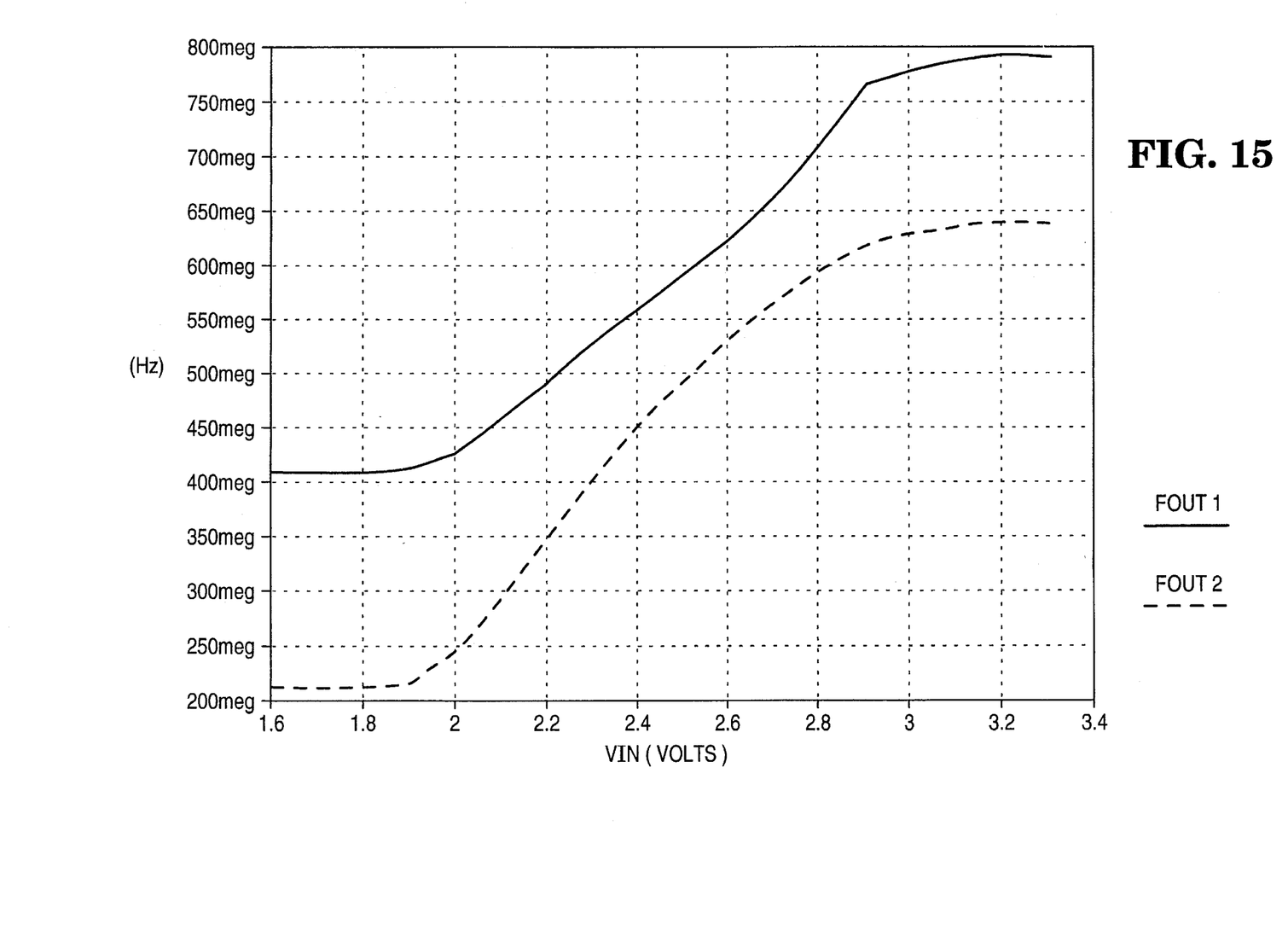
FIG. 15 shows simulation results of a multi-range VCO.

FIG. 15 shows the transfer characteristic of the multi-range ring oscillator using the improved delay cell described hereinabove. The plot is output frequency versus input voltage. The results illustrate how that, by selecting the different current mirrors, two different operating ranges can be achieved. Note the significant frequency shift in the transfer characteristic (i.e. the difference between the dotted and solid lines) when the current through the booster inverters is scaled to a different value. The frequency shift at mid-range is approximately 100 MHz. The gain of each plot is approximately the same. This is an important point, since loop stability could be compromised if the VCO gain is significantly varied.

While I have illustrated and described the preferred embodiments of our invention, it is to be understood that I do not limit myself to the precise constructions herein disclosed, and the right is reserved to all changes and modifications coming within the scope of the invention as defined in the appended claims.

We claim:

1. An extended range voltage controlled oscillator, comprising:

a plurality of delay cells with booster inverters;

a current source which restricts current in at least one of the booster inverters; and a bias circuit for piece-wise linearly biasing the current source.

2. The oscillator of claim 1 further comprising a plurality of voltage-to-current controlled converters.

3. The oscillator of claim 2 wherein a first voltage-to-current controlled converter is operatively coupled to at least one of the plurality of delay cells.

4. The oscillator of claim 2 wherein a second voltage-to-current controlled converter is operatively coupled to at least one of the booster inverters.

5. An improved phase-locked loop circuit, comprising:

a phase detector;

a charge pump operatively coupled to the phase detector;

a filter operatively coupled to the charge pump; and an oscillator operatively coupled to the filter, wherein the oscillator comprises (i) a plurality of delay cells with booster inverters; (ii) a controllable current source which restricts current in at least one of the booster inverters; and iii) a bias circuit for piece-wise linearly biasing the controllable current source.

6. The oscillator of claim 5 further comprising a plurality of voltage-to-current controlled converters.

7. The oscillator of claim 6 wherein a first voltage-to-current controlled converter is operatively coupled to at least one of the plurality of delay cells.

8. The oscillator of claim 6 wherein a second voltage-to-current controlled converter is operatively coupled to at least one of the booster inverters.

9. A method for extending an operating range of a phase-locked loop circuit comprising a plurality of delay cells, the method comprising the steps of:

controlling current in a booster inverter of at least one of said delay cells; and piece-wise linear biasing the booster inverter.

10. The method of claim 9 wherein the current in the booster inverter is restricted.

11. The method of claim 9 wherein the step of piece-wise linear biasing the booster inverter comprises maintaining a constant current in the booster inverter at relatively low frequencies, and linearly increasing current in the booster inverter at relatively high frequencies.

12. In combination:

a booster inverter; and means for maintaining a constant current in the booster inverter at relatively low frequencies, and linearly increasing current in the booster inverter at relatively high frequencies.

\* \* \* \* \*